US012283501B2

(12) United States Patent
Ota

(10) Patent No.: US 12,283,501 B2
(45) Date of Patent: Apr. 22, 2025

(54) SUBSTRATE PROCESSING APPARATUS, METHOD OF MANUFACTURING SEMICONDUCTOR DEVICE, METHOD OF PROCESSING SUBSTRATE, AND RECORDING MEDIUM

(71) Applicant: KOKUSAI ELECTRIC CORPORATION, Tokyo (JP)

(72) Inventor: Takayuki Ota, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 512 days.

(21) Appl. No.: 17/843,606

(22) Filed: Jun. 17, 2022

(65) Prior Publication Data

US 2023/0068123 A1    Mar. 2, 2023

(30) Foreign Application Priority Data

Aug. 27, 2021    (JP) .................................. 2021-138905

(51) Int. Cl.
   *H01L 21/67*        (2006.01)
   *H01L 21/687*       (2006.01)

(52) U.S. Cl.
   CPC .. *H01L 21/67259* (2013.01); *H01L 21/67276* (2013.01); *H01L 21/68764* (2013.01); *H01L 21/68792* (2013.01)

(58) Field of Classification Search
   CPC ......... H01L 21/67259; H01L 21/67276; H01L 21/68764; H01L 21/68792; H01L 21/677
   See application file for complete search history.

(56) References Cited

U.S. PATENT DOCUMENTS

2009/0243413 A1 * 10/2009 Gilchrist ................ H02K 29/03
                                                            310/90.5
2022/0260362 A1 * 8/2022 Kikuchi ............ H01L 21/67259

FOREIGN PATENT DOCUMENTS

| CN | 111026171 A    | 4/2020  |
|----|----------------|---------|
| JP | 63-191564 A    | 8/1988  |
| JP | 10-155291 A    | 6/1998  |
| JP | 2000-152676 A  | 5/2000  |
| JP | 2001-112102 A  | 4/2001  |
| JP | 2006-270092 A  | 10/2006 |

OTHER PUBLICATIONS

Japanese Office Action issued on Mar. 14, 2023 for Japanese Patent Application No. 2021-138905.

* cited by examiner

*Primary Examiner* — Moazzam Hossain
(74) *Attorney, Agent, or Firm* — Volpe Koenig

(57) ABSTRACT

An object transfer device includes: a motor; a motor drive circuit; an encoder that detects a motor output shaft rotation angle; a drive system that transmits motion of the output shaft to an object; an origin sensor that detects arrival of a predetermined site of the drive system interlocked with the object at a predetermined position; a drive circuit-including servo amplifier that records a current position of the object based on detection by the encoder and the origin sensor, and controls the object to a target position; an absolute position holder that acquires an absolute position of the predetermined site based on detection by the encoder at least while the drive circuit is off; and a power saving controller that is bidirectionally communicable with the servo amplifier and can resume servo control with the absolute position as a current position of the predetermined site when the drive circuit is on.

16 Claims, 7 Drawing Sheets

SUBSTRATE PROCESSING APPARATUS, METHOD OF MANUFACTURING SEMICONDUCTOR DEVICE, METHOD OF PROCESSING SUBSTRATE, AND RECORDING MEDIUM

TECHNICAL FIELD

The present disclosure relates to a substrate processing apparatus, a method of manufacturing a semiconductor device, a method of processing a substrate, and a recording medium.

BACKGROUND

In substrate processing in a semiconductor device manufacturing process, for example, a vertical substrate processing apparatus that collectively processes a plurality of substrates (semiconductor silicon wafers) is used. In this type of substrate processing apparatus, a pod transfer device that transfers a pod which is a sealed substrate container and a wafer transfer device (transfer machine) that transfers a substrate in the pod to a boat (substrate holder) are disposed. The pod transfer device is configured to be movable up and down, movable forward and backward, and movable laterally while holding the pod by control of a servo motor. The wafer transfer device includes a required number of wafer mounting plates that hold wafers. The wafer mounting plate is configured to be linearly movable in the horizontal direction, rotatable in the horizontal direction, and movable up and down in the vertical direction by control of a servo motor. JP 2000-152676 A proposes a method for controlling a motor adopted in a substrate processing apparatus. It is known that power consumption of such a transfer device including a plurality of servo motors is large.

SUMMARY

An advantage of the present disclosure is to provide a technique capable of reducing power consumption of a transfer device controlled by a servo motor.

One aspect of the present disclosure provides:

a technique including a transfer device that transfers an object, the transfer device including:
(a) a motor;
(b) a drive circuit of the motor;
(c) an encoder configured to detect a rotation angle of an output shaft of the motor;
(d) a drive system configured to transmit motion of the output shaft of the motor to the object;
(e) an origin sensor configured to detect that a predetermined site of the drive system interlocked with the object has reached a predetermined position;
(f) a servo amplifier including the drive circuit and configured to record a current position of the object based on detection by the encoder and the origin sensor and to control the object such that the object is located at a target position;
(g) an absolute position holder configured to acquire an absolute position of the predetermined site based on detection by the encoder at least while the drive circuit is turned off; and
(h) a power saving controller configured to be bidirectionally communicable with the servo amplifier and configured to be capable of resuming servo control with the absolute position recorded in the absolute position holder as a current position of the predetermined site when the drive circuit is turned on.

DETAILED DESCRIPTION

Figure 1:
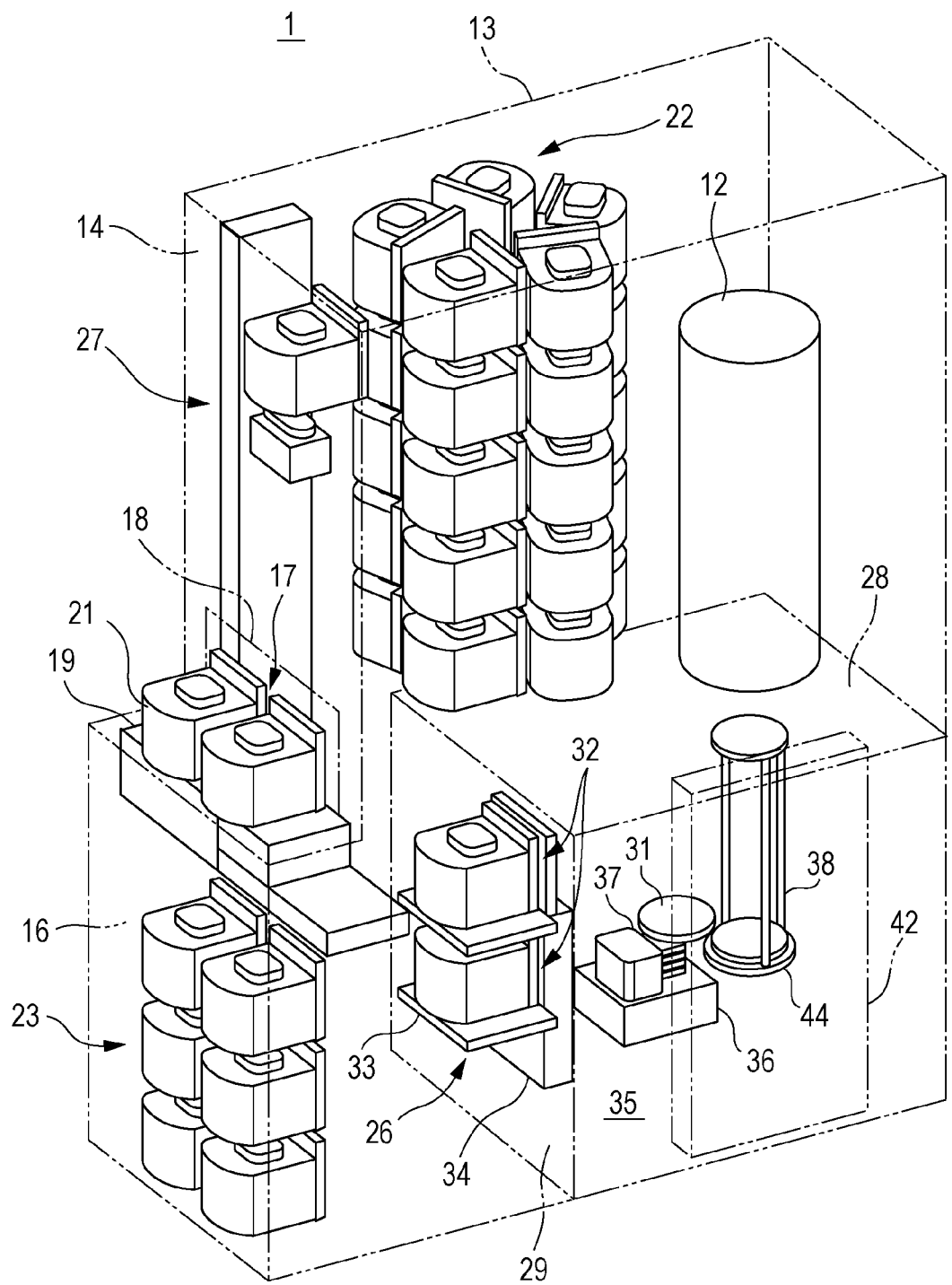
FIG. 1 is an oblique perspective view of a substrate processing apparatus suitably used in an embodiment of the present disclosure.

Hereinafter, an embodiment will be described with reference to the drawings. However, in the following description, the same components are denoted by the same reference numerals, and repeated description may be omitted. Note that, in order to make description clearer, the drawings may be schematically illustrated as compared with an actual aspect. However, the illustration is only an example and does not limit construe of the present disclosure.

A substrate processing apparatus described in the present embodiment is used in a semiconductor device manufacturing process, and heats a substrate to be processed by a heater in a state where the substrate is housed in a processing chamber to be processed. More specifically, the substrate processing apparatus described in the present embodiment is a vertical substrate processing apparatus that simultaneously processes a plurality of substrates in a state where the plurality of substrates is stacked at predetermined intervals in the vertical direction.

Examples of the substrate to be processed by the substrate processing apparatus include a semiconductor wafer substrate (hereinafter, simply referred to as a "wafer") in which a semiconductor device is built. Examples of processing performed by the substrate processing apparatus include oxidizing, diffusing, reflow and annealing for carrier activation and planarization after ion implantation, and film forming by thermal chemical vapor deposition (CVD) reaction. Such a substrate processing apparatus usually includes a substrate transfer device in order to automatically perform processing.

FIG. 1 illustrates a schematic configuration example of a substrate processing apparatus suitably used in the embodiment of the present disclosure. This device includes a power saving controller that turns on and off a transfer device, and can start servo control such as positioning control or motion control from a recorded current position when a drive circuit is turned on again.

As illustrated in FIG. 1, a substrate processing apparatus 1 includes a housing 13, in which a front maintenance door 16 that can be opened and closed is disposed below a front wall 14 of the housing 13. A maintenance person can enter the apparatus from the door 16 and can deal with a trouble of a transfer device.

A pod loading/unloading port 17 is formed on the front wall 14 of the housing 13. A load port 19 is configured to align a pod 21 mounted thereon. The pod loading/unloading port 17 is opened such that the inside and the outside of the housing 13 communicate with each other, and the pod loading/unloading port 17 is opened and closed by a front shutter 18 such that the pod 21 positioned by the load port 19 can be loaded into and unloaded from the apparatus 1.

The pod 21 is a sealed substrate container, and is loaded onto the load port 19 by an inter-step transfer device (not illustrated) and is unloaded from the load port 19.

A rotary pod shelf 22 is disposed in an upper portion in a substantially central portion in a front-rear direction in the housing 13, and the rotary pod shelf 22 is configured to store a plurality of the pods 21. A preliminary pod shelf 23 is disposed inside a front maintenance port and below the load port 19, and the preliminary pod shelf 23 is configured to store a plurality of the pods 21.

The rotary pod shelf 22 includes a support column (not illustrated) vertically erected and intermittently rotated, and a plurality of shelf plates (not illustrated) radially supported by the support column at upper, middle, and lower positions. The shelf plates are configured to store a plurality of the pods 21 while the pods 21 are mounted thereon.

A pod opener 26 is disposed below the rotary pod shelf 22, and the pod opener 26 has a configuration on which the pod 21 is mounted and a lid of the pod 21 can be opened and closed.

A pod transfer device 27 is disposed between the load port 19, and the rotary pod shelf 22 and the pod opener 26. The pod transfer device 27 is movable up and down, movable forward and backward, and movable laterally while holding the pod 21, and is configured to transfer the pod 21 among the load port 19, the rotary pod shelf 22, and the pod opener 26. The pod transfer device 27 includes a servo motor that makes the pod 21 movable up and down (transfer in the up-down direction), a servo motor that makes the pod 21 movable forward and backward (transfer in the front-rear direction), a servo motor that makes the pod 21 movable laterally (transfer in the left-right direction), three servo amplifiers that control the servo motors, and the like.

A sub housing 28 is disposed over a rear end in a lower portion on a rear side in the front-rear direction in the housing 13. On a front wall 29 of the sub housing 28, a pair of wafer loading/unloading ports 32 for loading/unloading a wafer (substrate) 31 into/from the sub housing 28 is formed in two stages of an upper stage and a lower stage in the vertical direction, and the pod opener 26 conforming to front-opening interface mechanical standard (FIMS) is disposed for each of the wafer loading/unloading ports 32.

The pod opener 26 includes a mounting table 33 on which the pod 21 is mounted, and an opening/closing mechanism 34 that opens and closes a lid of the pod 21. The pod opener 26 is configured to open and close a wafer inlet/outlet of the pod 21 by opening and closing the lid of the pod 21 mounted on the mounting table 33 by the opening/closing mechanism 34.

The sub housing 28 constitutes a transfer chamber (loading area) 35 airtightly isolated from a space (pod transfer space) in which the pod transfer device 27 and the rotary pod shelf 22 are disposed.

A wafer transfer mechanism (hereinafter, also referred to as a transfer machine) 36 is disposed in a front region of the transfer chamber 35. The transfer machine 36 includes a required number (five in the drawing) of wafer mounting plates (substrate supports) 37 that hold the wafers 31. The wafer mounting plates 37 are linearly movable in the horizontal direction, rotatable in the horizontal direction, and movable up and down in the vertical direction. The transfer machine 36 is configured to charge a boat (substrate holder) 38 with the wafer 31 and to discharge the wafer 31 from the boat 38. The transfer machine 36 includes a servo motor that makes the wafer mounting plate 37 linearly movable in the horizontal direction, a servo motor that makes the wafer mounting plate 37 rotatable in the horizontal direction, a servo motor that makes the wafer mounting plate 37 movable up and down in the vertical direction, three servo amplifiers that control the servo motors, and the like. The wafer mounting plate 37 is also called a tweezer, and can be constituted by, for example, five mounting plates.

A heater chamber (not illustrated) is disposed above the transfer chamber 35 with a scavenger (not illustrated) interposed therebetween, and a vertical processing furnace 12 is disposed therein. The processing furnace 12 forms a processing chamber therein, and a furnace opening on a lower side of the processing chamber is located in the scavenger. A lower end of the furnace opening is opened, and opened and closed by a furnace opening shutter (not illustrated).

A boat elevator 42 for lifting and lowering the boat 38 is disposed on a side surface of the sub housing 28. A seal cap 44 serving as a lid body is horizontally attached to an arm (not illustrated) connected to a lifting/lowering table of the boat elevator 42. The seal cap 44 vertically supports the boat 38, and can airtightly close the furnace opening in a state where the boat 38 is loaded into the processing furnace 12. The boat 38 is configured to hold a plurality of (for example, about 50 to 175) wafers 31 in multiple stages in a horizontal posture while aligning the wafers 31 at a center thereof.

A clean unit (not illustrated) is disposed at a position facing the boat elevator 42 side. The clean unit is constituted by a supply fan and a dustproof filter so as to supply clean air, which is a cleaned atmosphere or an inert gas. A notch alignment device (not illustrated) serving as a substrate alignment device that aligns the position of the wafer 31 in a circumferential direction can be disposed between the transfer machine 36 and the clean unit.

Clean air blown out from the clean unit is configured such that a part thereof is sucked by a local exhaust duct (or a common exhaust duct) or the like and exhausted to the outside of the housing 13 through the exhaust duct, and another part thereof is blown out into the transfer chamber 35 again by the clean unit after flowing through the notch alignment device, the transfer machine 36, and the boat 38.

Next, an operation of the substrate processing apparatus 1 will be described.

When the pod 21 is supplied to the load port 19, the pod loading/unloading port 17 is opened by the front shutter 18. The pod 21, which is a transfer object on the load port 19, is loaded into the housing 13 through the pod loading/unloading port 17 by the pod transfer device 27, and is mounted on a designated shelf plate of the rotary pod shelf 22. The pod 21 is temporarily stored in the rotary pod shelf 22, and then transferred from the shelf plate to one of the pod openers 26 and transferred to the mounting table 33, or directly transferred from the load port 19 to the mounting table 33 by the pod transfer device 27.

An opening side end surface of the pod 21 mounted on the mounting table 33 is pressed against an opening edge portion of the wafer loading/unloading port 32 on the front wall 29 of the sub housing 28, and a lid of the pod 21 is removed by the opening/closing mechanism 34 to open the wafer inlet/outlet.

When the pod 21 is opened by the pod opener 26, the transfer machine 36 takes out the wafer 31, which is a transfer object, from the pod 21 and charges the boat 38 with the wafer 31 (charging). The transfer machine 36 that has delivered the wafer 31 to the boat 38 returns to the pod 21 and charges the boat 38 with the next wafer 31.

When the boat 38 is charged with the number of wafers 31 designated in advance, the furnace opening of the processing furnace 12 closed by the furnace opening shutter is opened by the furnace opening shutter. Subsequently, the boat 38 is raised by the boat elevator 42 and the wafers 31 are loaded into the processing furnace 12 (loading).

After the loading, arbitrary processing is performed on the wafers 31 in the processing furnace 12. After the processing, the wafers 31 and the pod 21 are unloaded to the outside of the housing 13 by a procedure reverse to the above-described procedure.

(Configuration Example of Wafer Transfer Mechanism (Transfer Machine))

Figure 2:
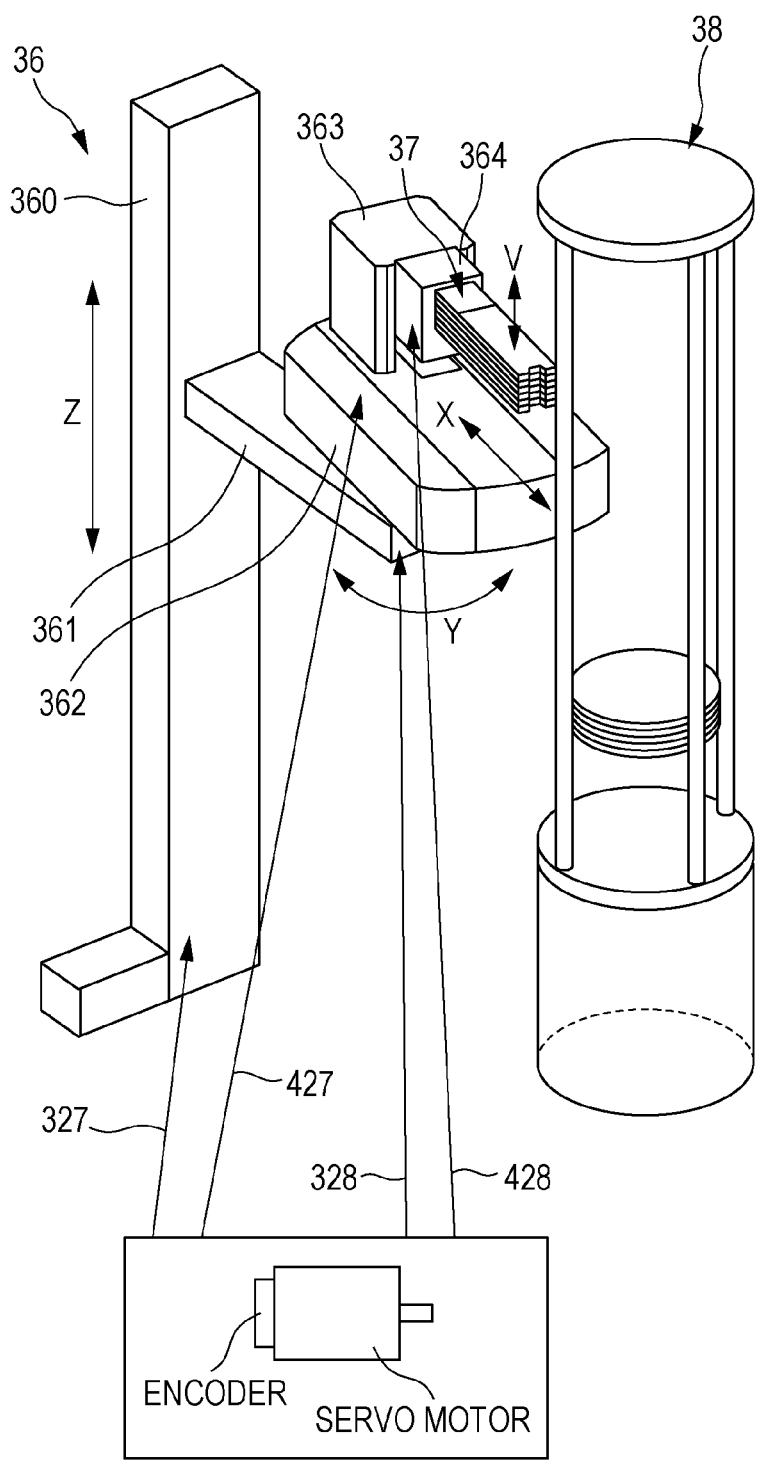
FIG. 2 is a schematic perspective view of a wafer transfer mechanism suitably used in the embodiment of the present disclosure.

FIG. 2 is a schematic perspective view of a wafer transfer mechanism suitably used in the embodiment of the present disclosure. A configuration example of the wafer transfer mechanism (transfer machine) will be described with reference to FIG. 2.

The transfer machine 36 includes a support column 360 disposed in the up-down direction (Z-axis direction), a Z-axis direction driver 361, a Y-axis rotation driver 362, an X-axis direction driver 363, and a V-axis direction driver 364. The drivers 361 to 364 can be rephrased as a drive system. A transfer object of the transfer machine 36 is the wafer 31.

The Z-axis direction driver 361 is disposed on the support column 360 so as to be movable up and down (in the Z-axis direction) in order to move the wafer mounting plate 37 in the up-down direction (Z-axis direction, vertical direction). For example, by disposing a servo motor 327 including an encoder in the support column 360, the Z-axis direction driver 361 is movable up and down in the Z-axis direction by rotation control of an output shaft of the servo motor 327.

The Y-axis rotation driver 362 is disposed on an upper surface of the Z-axis direction driver 361 so as to be rotatable in the Y-axis direction in order to rotationally move the wafer mounting plate 37 (rotate the wafer mounting plate 37 in the Y-axis direction) clockwise or counterclockwise in the horizontal direction. For example, by disposing a servo motor 328 including an encoder in the Z-axis direction driver 361, the Y-axis rotation driver 362 is rotatable clockwise or counterclockwise in the Y-axis direction by rotation control of an output shaft of the servo motor 328.

The X-axis direction driver 363 is disposed on an upper surface of the Y-axis rotation driver 362 so as to be movable back and forth (in the X-axis direction) in order to move the wafer mounting plate 37 back and forth in the horizontal direction (X-axis direction). For example, by disposing a servo motor 427 including an encoder in the Y-axis rotation driver 362, the X-axis direction driver 363 is movable back and forth in the X-axis direction by rotation control of an output shaft of the servo motor 427.

The V-axis direction driver 364 is disposed in the X-axis direction driver 363, and is configured to be able to adjust an interval between adjacent wafer mounting plates 37 out of the five wafer mounting plates 37 in the Z-axis direction. For example, by disposing a servo motor 428 including an encoder in the X-axis direction driver 363, the V-axis direction driver 364 is configured to be able to adjust an interval between adjacent wafer mounting plates 37 out of the five wafer mounting plates 37 in the Z-axis direction by rotation control of an output shaft of the servo motor 428.

As a result, the transfer machine 36 takes out the wafer 31, which is an object, from the pod 21 and charges the boat 38 with the wafer 31 (charging). A process is performed on the wafer 31 in the processing furnace 12, and then the transfer machine 36 takes out the wafer 31 from the boat 38 (discharge) and charges the pod 21 with the wafer 31.

The encoder disposed in each of the servo motors 327, 328, 427, and 428 is configured, for example, to detect a rotation position (rotation angle) of an output shaft of each of the servo motors 327, 328, 427, and 428, and to output a detection result of the rotation position (rotation angle) as an electric signal to servo amplifiers (325 and 326) described with reference to FIG. 3. This type of encoder is also called a rotary encoder.

Figure 3:
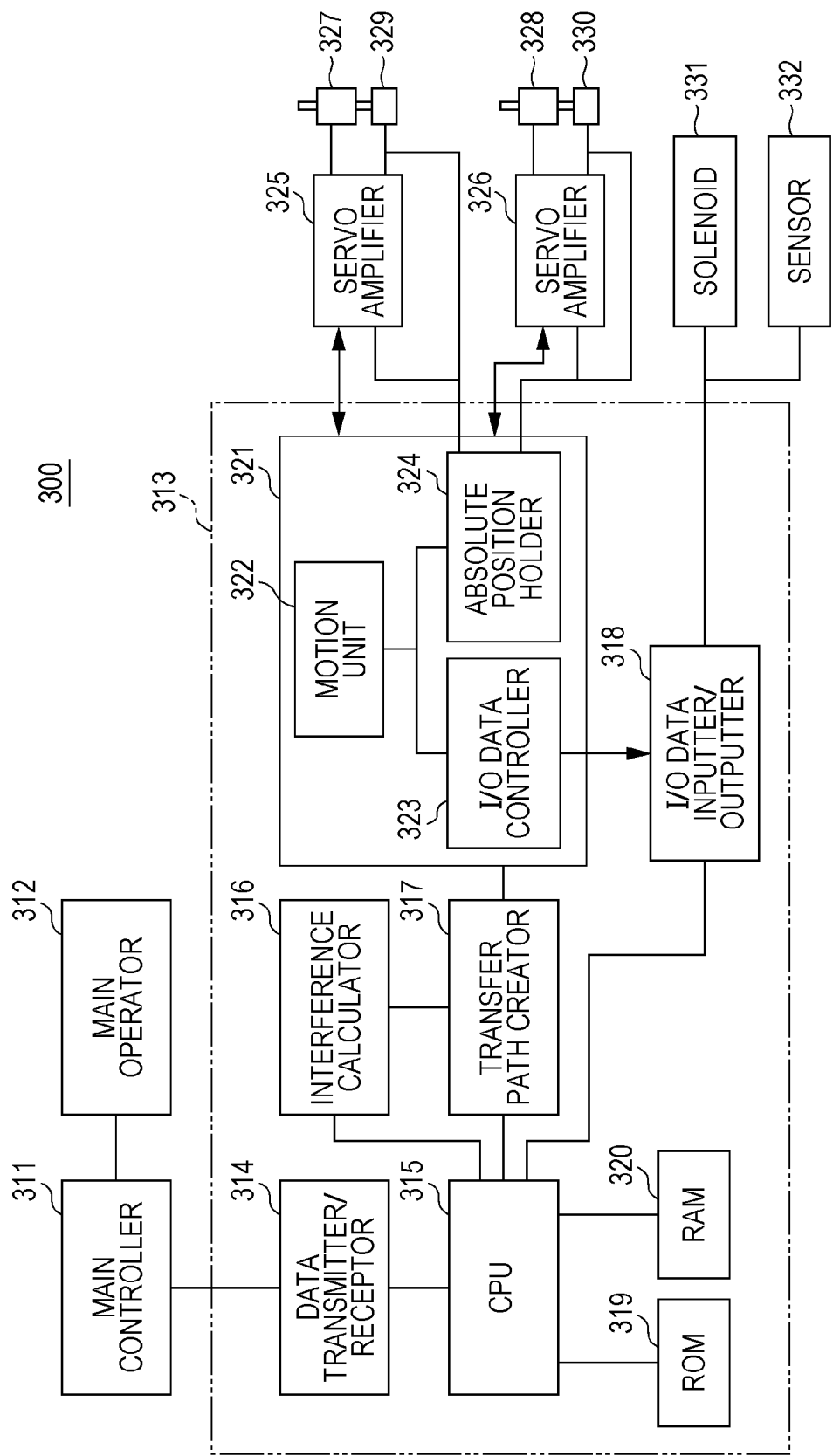
FIG. 3 is a block diagram illustrating a schematic configuration of a motor control device that controls a wafer transfer mechanism suitably used in the embodiment of the present disclosure.

FIG. 3 is a block diagram illustrating a schematic configuration of a motor control device that controls a wafer transfer mechanism suitably used in the embodiment of the present disclosure. FIG. 3 illustrates a configuration example of a motor control device 300 that controls the servo motors 327 and 328 disposed in the wafer transfer mechanism (transfer machine) 36 by the servo amplifiers 325 and 326 as a representative example. Although not illustrated, it is possible to similarly control the servo motors 427 and 428 by adding two servo amplifiers that control the servo motors 427 and 428 disposed in the transfer machine 36 to the motor control device 300 illustrated in FIG. 3.

As illustrated in FIG. 3, the motor control device 300 includes a main controller 311 that integrally controls the entire substrate processing apparatus 1 including the drivers (361 to 364) of the wafer transfer mechanism 36, a main operator 312 connected to the main controller 311, and a power saving (host) controller 313 connected to the main controller 311 and the servo amplifiers 325 and 326 so as to be bidirectionally communicable therewith.

The power saving controller 313 includes a data transmitter/receptor 314 connected to the main controller 311, a central processing unit (CPU) 315 connected to the data transmitter/receptor 314, an interference calculator 316, a transfer path creator 317, and a data input/output (I/O unit) 318 each connected to the CPU 315, a first memory 319 such as a read only memory (ROM), a second memory 320 such as a random access memory (RAM), and an operation controller 321 connected to the transfer path creator 317. The power saving controller 313 can be implemented by an industrial sequencer.

The CPU 315 controls the interference calculator 316, the transfer path creator 317, and the operation controller 321 to convert an abstract operation request from the main controller 311 into a detailed position command based on the state of the driver 361, and gives the position command to the servo amplifiers 325 and 326. In addition, when the CPU 315 receives a servo OFF/servo ON request from the main controller 311, the CPU 315 controls the operation controller 321 so as to transmit a corresponding command to the corresponding servo amplifiers 325 and 326.

The interference calculator 316 and the transfer path creator 317 are connected to each other, and data can be transmitted and received between the interference calculator 316 and the transfer path creator 317. A program of the CPU 315 from the main operator 312, a system parameter file in which a wafer transfer pattern or the like is set, and the like are stored in the first memory 319, and data of current positions of the drivers (361 to 364) and the like are stored in the second memory 320. The program and the system parameter file can be read from an external recording medium or the like by the main controller 311 and given via the data transmitter/receptor 314 and the CPU 315.

The operation controller 321 includes a motion unit 322, an I/O data controller 323 connected to the motion unit 322, and an absolute position holder 324. The motion unit 322 provides interpolation and speed control for smoothly moving the drivers of the wafer transfer mechanism 36, calculates rotation amounts of the pulse motors (also referred to as servo motors) 327 and 328 described later corresponding to positions (angles) at which the drivers should be located at the time of driving in time series, and generates a position command.

A required number (two in the drawing) of servo amplifiers 325 and 326 are connected to the motion unit 322 by a bidirectional interface. The pulse motors 327 and 328 that drive the drivers (361 and 362) and encoders 329 and 330 mechanically connected to the pulse motors 327 and 328 are connected to the servo amplifiers 325 and 326, respectively. The motion unit 322 transmits the generated position command to the servo amplifiers 325 and 326 in a form of a command, an A-phase/B-phase pulse, or the like. The position command usually designates a relative position (movement amount) with respect to a current position. The servo amplifiers 325 and 326 perform feedback control (servo control) such that a position indicated by the corresponding encoders 329 and 330 coincides with the position command.

The absolute position holder 324 is electrically connected to the servo amplifiers 325 and 326, is configured to be able to receive a command indicating a state from the servo amplifiers 325 and 326 and position information (pulse) from the encoders 329 and 330, continuously counts a pulse from the encoders 329 and 330 at all times including a servo OFF state (described later), and holds absolute positions of the drivers. More preferably, the whole or a part of the absolute position holder 324 is implemented by an independent low-power microcomputer whose power is backed up by a battery, and even when the power saving controller 313 or the servo amplifier is in a non-energized state, a pulse from the encoders 329 and 330 can be counted without limiting the number of rotations. Note that some or all of the functions of the motion unit 322 or the absolute position holder 324 can also be disposed in each of the servo amplifiers 325 and 326.

The I/O unit 318 is connected to the I/O data controller 323 of the operation controller 321. A solenoid 331 for locking output shafts of the pulse motors 327 and a sensor 332 for confirming an operation thereof are connected to the I/O unit 318.

Figure 7:
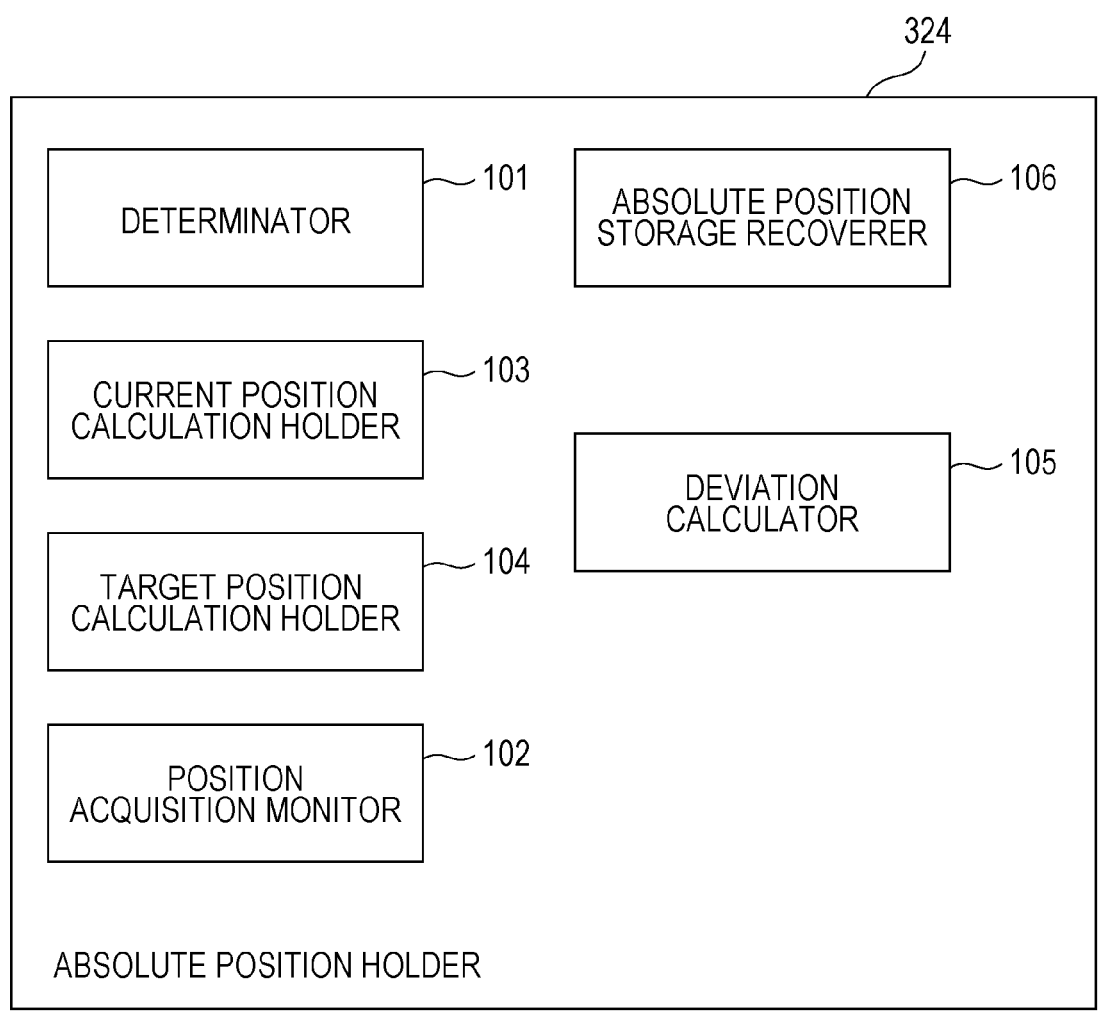
FIG. 7 is a block diagram of an absolute position holder suitably used in the embodiment of the present disclosure.

FIG. 7 illustrates a configuration of the absolute position holder 324. The absolute position holder 324 includes a determinator 101 that determines whether the pulse motors 327 and 328 are in operation or in stop, a position acquisition monitor 102 that acquires a position detected by the encoders 329 and 330 and monitors whether or not there is a change in the position (generation of a pulse) in motor stop, a current position calculation holder 103, a target position calculation holder 104, a deviation calculator 105, and an absolute position storage recovery 106. These can be implemented by software as functional modules.

Hereinafter, an operation will be described. When wafer transfer is required during execution of a substrate processing recipe, the main controller 311 sends an operation request to the CPU 315 via the data transmitter/receptor 314 as a required operation request signal. This operation request signal has contents of, for example, taking out the wafer 31 from a certain slot of the boat 38 to a certain slot of the pod 21 on the pod opener 26. The CPU 315 reads a wafer transfer pattern set in a system parameter file from the first memory 319 based on the operation request signal, and causes the interference calculator 316 to analyze whether or not the transfer machine 36 can transfer a wafer without colliding with a surrounding mechanism or the transfer machine 36 itself. In addition, the CPU 315 causes the transfer path creator 317 to create a path for wafer transfer that achieves less useless motion or the shortest time based on a result of the interference calculation. Note that the interference calculator 316 and the transfer path creator 317 may perform cooperative operation, or may store a wafer transfer pattern calculated in advance so as not to cause interference and determine the wafer transfer pattern as a path as it is.

A path created by the transfer path creator 317 is sent as a control signal from the transfer path creator 317 to the operation controller 321. The control signal is input to the motion unit 322, and the motion unit 322 sends the position command to the servo amplifiers 325 and 326 and the determinator 101 of the absolute position holder 324, and sends the control signal to the I/O unit 318 according to a sequence program and a parameter. The motion unit 322 generates and sends a position command expressed by a relative position from a path expressed by an absolute position, but may send the absolute position as it is to the absolute position holder 324. When receiving a position command in which the speed is non-0, the determinator 101 determines that the pulse motors 327 and 328 are in operation until receiving an operation completion report signal (described later).

A control signal sent to the I/O data controller 323 is sent to the solenoid 331 and the sensor 332 via the I/O unit 318, the solenoid 331 performs a required operation by the control signal, and the sensor 332 detects an operation state of the solenoid 331. The solenoid 331 is disposed in an output shaft or the like of the pulse motor 327 of the driver 361 that receives a load of gravity. Similarly, the solenoid 331 fixes or brakes the output shaft by biasing of a spring or the like at the time of non-energization such as power cut, and prevents or loosens falling of the driver 361. Alternatively, the solenoid 331 may be energized during servo OFF by active control of the CPU to fix the output shaft.

The pulse motors 327 and 328 drive the drivers (361 to 364), and the encoders 329 and 330 generate a number of pulses corresponding to the rotation amount of the pulse motors 327 and 328, respectively.

The number of pulses is fed back to the servo amplifiers 325 and 326 and the position acquisition monitor 102 of the absolute position holder 324, the servo amplifiers 325 and 326 are feedback-controlled, and the current position calculation holder 103 updates data (pulse count value) of current positions of the drivers (361 to 364) by the number of pulses fed back to the position acquisition monitor 102. This current position may be independent of a value of an internal counter which the servo amplifiers 325 and 326 each include inside and counts a pulse of the encoder 329, or may be a value of an internal counter itself. A command that acquires a value of an internal counter from the servo amplifiers 325 and 326 can be used.

When the drivers (361 to 364) reach target positions, the servo amplifiers 325 and 326 return an operation completion report signal to the absolute position holder 324, and the determinator 101 determines that the pulse motors 327 and 328 have reached target positions. The operation completion report signal is controlled by the I/O data controller 323, and then can also be transmitted to the transfer path creator 317, the CPU 315, and the like. When receiving a series of position commands sent from the motion unit 322 or the like or an operation completion report signal corresponding to a position command in which the speed is 0 last time, the determinator 101 determines that the pulse motors 327 and 328 have stopped, acquires data of the absolute positions of the drivers (361 to 364) corresponding to the last position command from the current position calculation holder 103, and stores the data as previous stop positions in the second memory 320 via the CPU 315.

The target position calculation holder 104 of the absolute position holder 324 accumulates a position command such as a relative position or an A-phase/B-phase pulse or holds the latest absolute position from the motion unit 322 to hold data of the target position. The deviation calculator 105 obtains a deviation between data of the target positions of the drivers (361 to 364) held by the target position calculation holder and data of the current positions held by the current position calculation holder, and calculates the number of deviation pulses. Actually, since a scale is different between these data, data of the target positions multiplied by a predetermined coefficient is used. This deviation is originally 0 when the feedback control converges while the servo amplifiers 325 and 326 are in a servo ON state, and can be non-0 when the servo amplifiers 325 and 326 lose the absolute positions.

When detecting a command or a position command for executing machine origin return (described later) to the servo amplifiers 325 and 326, the determinator 101 resets data of the current position held by the current position calculation holder 103 and the target position calculation holder when a corresponding servo amplifier completes execution of the command to a value corresponding to the origin, for example, 0. The determinator 101 also stores the data in the second memory 320. When determining that the servo amplifiers 325 and 326 have lost the current absolute positions based on the deviation calculated by the deviation calculator 105, the determinator 101 can also notify the CPU 315 of the deviation via the I/O unit 318, and the CPU 315 can cause the operation controller 321 to send a command to correct the current positions of the servo amplifiers based on the deviation.

The absolute position storage recovery 106 of the absolute position holder 324 preferably includes a nonvolatile memory, and acquires data of the current positions of the drivers (361 to 364) when the rotation axis is fixed by the solenoid 331 from the current position calculation holder 103 and stores the data in the memory, or writes the data in the second memory 320 via the CPU 315 and the transfer path creator 317. In addition, the absolute position storage recovery 106 reads the data from the memory or the second memory 320 as necessary when fixation is released, and can restore the current position of the current position calculation holder. The absolute position storage recovery 106 is not essential.

At the time of return from the servo OFF state to the servo ON state, the CPU 315 causes the operation controller 321 to output a position command to reversely move by the number of deviation pulses received from the deviation calculator 105 of the absolute position holder 324 or a pulse train correction command to the servo amplifiers 325 and 326, and returns the driver shifted during the servo OFF state to a correct position. Note that this correction command is ignored (that is, not accumulated) in the target position calculation holder 104, only the current position calculation holder 103 is updated, and the current position coincides with the target position. Note that the speed or torque in the correction command can be suppressed to be smaller than a usual value. In another method, when generating a first path or a position command after return to the servo ON state, the transfer path creator 317 or the motion unit 322 generates a path or the like having the current position held by the current position calculation holder 103 as a start position. That is, each driver is driven so as to substantially stand still with the shifted current position even after the return and then directly move to the next target position. Specifically, after return to the servo ON state, the CPU 315 sets the previous stop position acquired from the current position calculation holder 103 and stored in the second memory 320 as a starting point. Correspondingly, when receiving the target position as a relative position, the target position calculation holder 104 performs processing of making the data of the current position coincide with the data of the target position by, for example, adding the deviation converted into the scale of the data of the target position to the data of the target position, and resets the number of deviation pulses to 0.

The absolute position holder 324 may count a pulse from the encoders 329 and 330 and update the absolute position only while the pulse motors 327 and 328 are stopped or in the servo OFF state. In this case, the position acquisition monitor 102 and/or the current position calculation holder 103 are enabled from the determinator 101 based on determination of stop of the pulse motors 327 and 328 or a servo OFF command from the CPU 315. Since the data of the current position calculation holder 103 immediately before the servo ON indicates a deviation, the target position calculation holder 104 and the deviation calculator 105 can be omitted. The position acquisition monitor 102 is implemented as an interrupt process in a microcomputer, and notifies the determinator 101 that a pulse is input during the servo OFF. The determinator 101 determines that the pulse motors 327 and 328 have been moved by an external force or the like, and issues an abnormality signal. An operation of the CPU 315 when return to the servo ON state is similar to that described above.

Note that, in the above embodiment, the encoder may be a linear encoder, the motor may be a linear motor, or the motor may be another actuator such as a servo motor.

Furthermore, monitoring of presence or absence of generation of a pulse in the encoders 329 and 330 does not have to be performed intermittently, and may be performed continuously while output of a pulse train to the servo amplifiers 325 and 326 is stopped.

Figure 4:
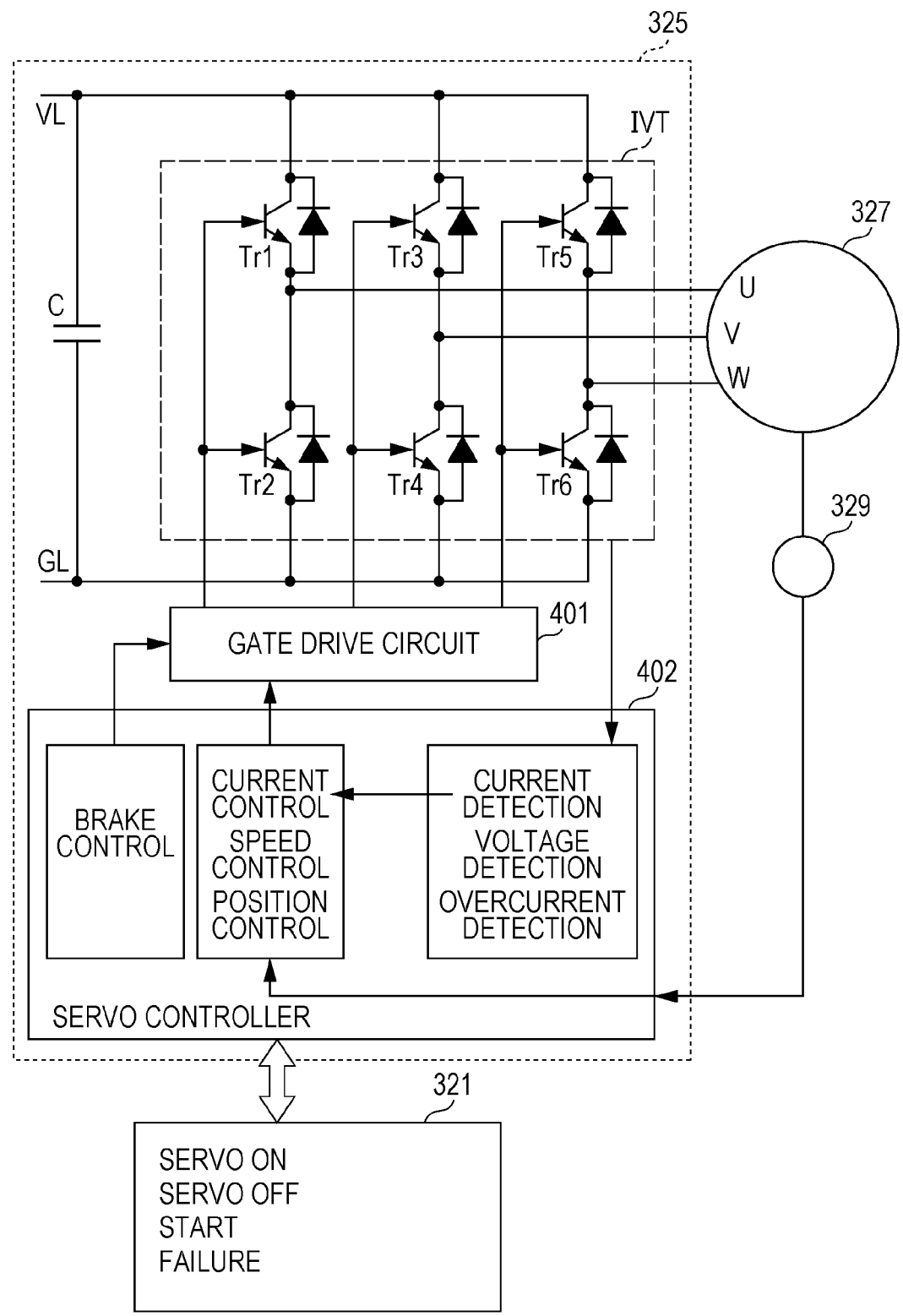
FIG. 4 is a block diagram illustrating a schematic configuration of a servo amplifier suitably used in the embodiment of the present disclosure.

Next, a configuration example of the servo amplifier 325 will be described as a representative example with reference to FIG. 4. The servo amplifier 326 and the two servo amplifiers that control the servo motors 427 and 428 can also each have a similar configuration to that of FIG. 4. FIG. 4 is a block diagram illustrating a schematic configuration of a servo amplifier suitably used in the embodiment of the present disclosure.

The servo amplifier 325 includes an inverter (IVT) connected to a U phase, a V phase, and a W phase of the servo motor 327, a ground potential line GL that supplies a ground potential to the inverter, a power supply potential line VL that supplies a power supply potential higher than the ground potential to the inverter IVT, and a smoothing capacitor C connected between the ground potential line GL and the power supply potential line VL. Although not illustrated, for example, an AC/DC conversion circuit (converter) that converts a 200 V three-phase AC power supply or a 100 V single-layer AC power supply into a DC power supply is connected to the ground potential line GL and the power supply potential line VL.

The inverter IVT includes first and second power semiconductor elements Tr1 and Tr2 that drive the U phase, third and fourth power semiconductor elements Tr3 and Tr4 that drive the V phase, and fifth and sixth power semiconductor elements Tr5 and Tr6 that drive the W phase. In this example, each power semiconductor element (Tr1 to Tr6) is constituted by an insulated gate bipolar transistor (IGBT).

The servo amplifier 325 includes a gate drive circuit 401 and a servo controller 402. The gate drive circuit 401 supplies and stops a gate drive signal for turning on and off each power semiconductor element (Tr1 to Tr6) of the inverter IVT based on a gate signal from the servo controller 402. The inverter IVT can also be referred to as a drive circuit of the servo motor 327.

The servo controller 402 outputs a gate signal such that a pulse motor moves to a designated position at an appropriate speed based on a received position command and a detection value of the encoder 329.

In addition, the servo controller 402 has a function of performing voltage detection of the power supply potential line VL, overcurrent detection of each power semiconductor element (Tr1 to Tr6), current detection of the U phase, the V phase, and the W phase, and the like, and performs speed control and current (torque) control while performing position control. The servo controller 402 can perform brake control or the like based on, for example, a value of voltage detection of the power supply potential line VL or a value of overcurrent detection of each power semiconductor element (Tr1 to Tr6). In addition, the servo controller 402 can perform torque limit control for reducing the speed or shortening the width of a gate signal based on a torque value calculated from a current in the U phase, the V phase, or the W phase.

The servo controller 402 of the servo amplifier 325 is configured to be able to bidirectionally communicate with the motor controller 324 of the power saving controller 313. The operation controller 321 can transmit a command such as a position command, servo ON, servo OFF, machine origin return, or start (normal rotation start/reverse rotation start) to the servo controller 402, and can receive an operation completion report signal, failure information, and the like from the servo controller 402.

For example, when the servo controller 402 receives a command for servo ON by a command or a logic signal, the servo amplifier 325 enters a servo ON state. In the servo ON state, power is supplied to the gate drive circuit 401, a drive circuit of the servo motor 327 is brought into an ON state, and the servo amplifier 325 can operate the servo motor 327. In other words, a feedback loop of the servo control is closed.

On the other hand, when the servo controller 402 receives a command to release servo ON such as a low-level logic signal (that is, a command for servo OFF), the servo amplifier 325 enters a servo OFF state. In the servo OFF state, power supply to the gate drive circuit 401 is cut off, or output of all the gate signals to the gate drive circuit 401 is prohibited, all the power semiconductor elements Tr1 to Tr6 become non-conductive, and the drive circuit of the servo motor 327 is brought into an OFF state. In other words, a feedback loop of the servo control is opened. Therefore, the servo motor 327 enters a free-run state. In the servo OFF state, the servo amplifier 325 and the servo motor 327 are not energized, and are therefore brought into a low power consumption state. The servo OFF state can be referred to as a power saving state in which an excitation current for generating a holding torque is unnecessary.

The power saving controller 313 can command the servo amplifier 325 to continue recording of the current position output from the encoder 329 while the drive circuit of the servo motor 327 is in an OFF state. The power saving controller 313 can also command the servo amplifier 325 to resume the servo control of the servo motor 327 with the absolute position recorded in the servo amplifier 325 as the current position when the drive circuit of the servo motor 327 is brought into an ON state. Although not illustrated, the power saving controller 313 also gives commands similar to those described above to the servo motor 328 and the servo amplifier 326, and to the servo motors 427 and 428 and the servo amplifiers disposed corresponding to the servo motors 427 and 428.

The power saving controller 313 controls the servo amplifier 325 such that an object (here, the Z-axis direction driver 361) stands still at the current position during a period from return from a power saving state in which the drive circuit of the servo motor 327 is in an OFF state (the drive circuit of the servo motor 327 is in an ON state) to giving a new target position (command) to the servo controller 402 of the servo amplifier 325.

Figure 5:
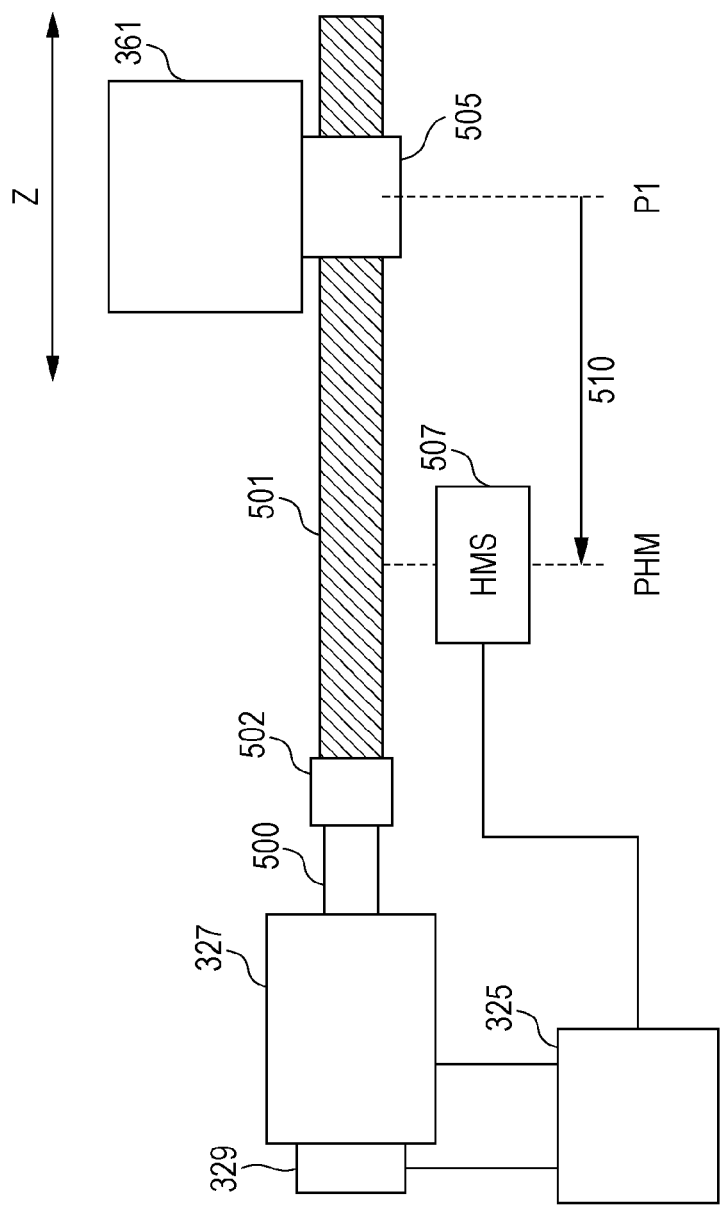
FIG. 5 is a configuration diagram for explaining a schematic configuration of a drive system of a servo motor suitably used in the embodiment of the present disclosure.

Next, a schematic configuration of a drive system of a servo motor will be described with reference to FIG. 5. FIG. 5 is a configuration diagram for explaining a schematic configuration of a drive system of a servo motor suitably used in the embodiment of the present disclosure.

FIG. 5 illustrates a configuration example between the servo motor 327 and the Z-axis direction driver 361 as a representative example.

A screw mechanism 501 is attached to an output shaft 500 of the servo motor 327 with a fixing member 502. A fixing member 505 attached to the Z-axis direction driver 361 is attached to the screw mechanism 501 so as to be rotatable during output. The fixing member 505 includes a ball screw or the like that converts rotational motion into linear motion. When the output shaft 500 of the servo motor 327 is rotated, the rotational motion of the output shaft 500 is transmitted to the screw mechanism 501 to rotate the screw mechanism 501. The rotational motion of the screw mechanism 501 is transmitted to the Z-axis direction driver 361, and the Z-axis direction driver 361 is movable in the Z-axis direction.

In FIG. 5, a machine origin sensor (HMS) 507 such as a photomicro sensor or a proximity sensor is disposed at a position PHM of a home position serving as a machine origin (positioning reference point).

The machine origin sensor 507 can detect that a predetermined site (for example, a central portion of the fixing member 505) of the Z-axis direction driver 361, which is a drive system interlocked with an object, has reached a predetermined position. The servo amplifier 325 is configured to be able to receive detection of the machine origin sensor 507. Therefore, in mechanical origin return operation 510 of the servo amplifier 325, when the Z-axis direction driver 361 is located at a position P1, the Z-axis direction driver 361 can move to the position PHM serving as the mechanical origin and return to the mechanical origin.

The servo amplifier 325 records or acquires a current position of an object (wafer 31) or the Z-axis direction driver 361 based on a detection value of the encoder 329 and a detection value of the machine origin sensor 507, and performs control such that the object (wafer 31) or the Z-axis direction driver 361 is located at a target position. The power saving controller 313 controls the servo amplifier 325 such that the Z-axis direction driver 361 is located at the position PHM serving as the home position before entering the power saving state in which the drive circuit of the servo motor 327 is in an OFF state. Note that, between the Y-axis rotation driver 362, the X-axis direction driver 363, and the V-axis direction driver 364 of the transfer machine 36 and the servo motors 328, 427, 428, respectively, as illustrated in FIG. 5, a screw mechanism, a gear mechanism, and a machine origin sensor are disposed. Similarly, the power saving controller 313 controls the servo amplifier (326) and two servo amplifiers that control the servo motors 427 and 428 such that each of the drivers (362, 363, and 364) is located at the position PHM serving as the home position before entering the power saving state in which the drive circuits of the servo motors (328, 427, and 428) are in an OFF state. The home position of the driver that receives a load due to gravity all the time can be set near a position lowered most by gravity.

As a result, before entering the power saving state, by returning each of the drivers 361, 362, 363, and 364 to the home position where interference (collision between movable units such as the drivers 361, 362, 363, and 364 or collision with a surrounding fixed article) is less likely to occur only by movement of one shaft, a risk of interference of the wafer transfer mechanism (transfer machine) 36 can be reduced. This is effective when the power saving controller 313 does not include the interference calculator 316.

In the configuration example of FIG. 3, the configuration example in which the current position is stored in the power saving (host) controller 313 has been described, but the present disclosure is not limited thereto. The current position may be stored in an encoder disposed in a servo motor.

Each of the servo motors 327, 328, 427, and 428 including an encoder preferably adopts an absolute position detection system. The servo motor adopting the absolute position detection system can detect an absolute position of an object (here, each of the drivers 361 to 364) all the time and store the absolute position in an encoder by battery backup regardless of the ON/OFF state of a power supply of the power saving controller 313. Therefore, if the machine origin of each of the drivers (361 to 364) is once set at the time of installing the wafer transfer mechanism 36, return to the origin at the time of subsequent power-on is not necessary, and there is an effect that recovery can be easily performed even in a case of power cut or a failure. In addition, in a case where absolute position data is backed up by a supercapacitor disposed in an encoder, even when a cable is attached or detached or the cable is disconnected, the absolute position data can be held during a predetermined period of time.

As a result, when the servo amplifier 325 changes from a servo OFF state to a servo ON state and the drive circuit is brought into an ON state again, there is an effect that the operations of the servo motors 327, 328, 427, and 428 can be started without returning to the origin with the absolute position data held in the encoder as the current position.

Figure 6:
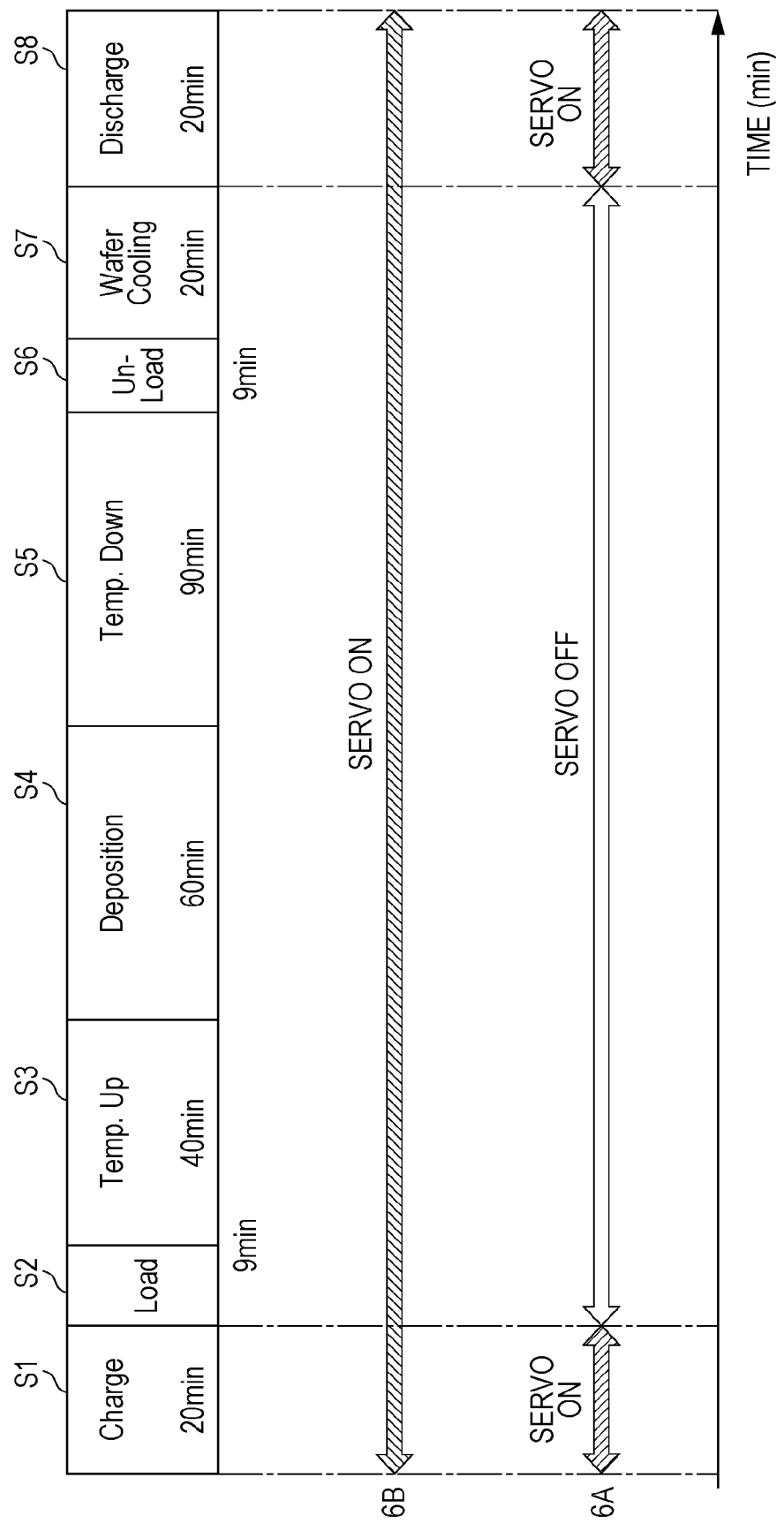
FIG. 6 is an explanatory diagram illustrating an operation timing of a servo motor suitably used in the embodiment of the present disclosure.

Next, an operation timing of a servo motor in a method of manufacturing a semiconductor device will be described with reference to FIG. 6. FIG. 6 is an explanatory diagram illustrating an operation timing of a servo motor suitably used in the embodiment of the present disclosure. FIG. 6 illustrates a relationship between a film formation recipe of a semiconductor manufacturing apparatus 1 serving as a method of manufacturing a semiconductor device and an operation timing of a servo motor of the wafer transfer mechanism (transfer machine) 36.

The operation timing of the servo motor indicates an operation timing 6B of a servo motor according to Comparative Example and an operation timing 6A of a servo motor according to the embodiment.

The film formation recipe of the semiconductor manufacturing apparatus 1 includes steps S1 to S8.

Step S1 is a step of charging the boat 38 with the wafer 31 using the transfer machine 36 (Charge). Step S1 has a working time of 20 minutes in this example.

Step S2 is a step of loading the boat 38 into the processing furnace 12 (Load). Step S2 has a working time of nine minutes in this example.

Step S3 is a step of raising the temperature of the processing furnace 12 to a predetermined processing temperature (Temp. Up). Step S3 has a working time of 40 minutes in this example.

Step S4 is a step of forming a desired film on the wafer 31 (Deposition). Step S4 has a working time of 60 minutes in this example.

Step S5 is a step of lowering the temperature of the processing furnace 12 to a predetermined temperature (Temp. Down). Step S5 has a working time of 90 minutes in this example.

Step S6 is a step of taking out the boat 38 from the processing furnace 12 (Unload).

Step S6 has a working time of nine minutes in this example.

Step S7 is a step of cooling the wafer 31 to a predetermined temperature (Wafer Cooling). Step S7 has a working time of 20 minutes in this example.

Step S8 is a step of taking out the wafer 31 from the boat 38 using the transfer machine 36 (Discharge). Step S8 has a working time of 20 minutes in this example.

First, the operation timing 6B of the servo motor according to Comparative Example will be described. At the operation timing 6B of the servo motor according to Comparative Example, the transfer machine 36 operates during the time of steps S1 and S8 (40 minutes), and the servo motors 327, 328, 427, and 428 of the wafer transfer mechanism (transfer machine) 36 are in a servo ON state during all the time of steps S1 to S8 (268 minutes). Therefore, the servo motors 327, 328, 427, and 428 consume unnecessary power during the time of steps S2 to S7 (228 minutes).

On the other hand, at the operation timing 6A of the servo motor according to the embodiment, the servo motors 327, 328, 427, and 428 are in a servo ON state during the time of steps S1 and S8 (40 minutes) in which the transfer machine 36 operates. The servo motors 327, 328, 427, and 428 are switched from a servo OFF state to a servo ON state by a command from the power saving controller 313, and step S1 is executed by the transfer machine 36. After step S8, the servo motors 327, 328, 427, and 428 are brought into a servo OFF state by a command of the power saving controller 313.

The servo motors 327, 328, 427, and 428 are in a servo OFF state during the time of steps S2 to S7 (228 minutes) in which the transfer machine 36 does not operate. Therefore, since the servo motors 327, 328, 427, and 428 do not consume unnecessary power during steps S2 to S7, the servo motors 327, 328, 427, and 428 of the transfer machine 36 operate with low power consumption.

During the servo OFF, an absolute position such as a rotation position is recorded in an encoder adopting an absolute position detection system. During the servo ON, the servo motors (327, 328, 427, and 428) can be restarted with the absolute position stored in the encoder as the current position without returning to the origin. As a result, a technique capable of reducing power consumption of a transfer device controlled by a servo motor can be provided. The transfer device is the transfer machine 36 or the pod transfer device 27, and the transfer object is the wafer 31 or the pod 21, for example, in the substrate processing apparatus 1 of FIG. 1.

Next, a maintenance method of the transfer machine 36 will be described. The transfer machine 36 performs a process of transferring the wafer 31 under control of the power saving controller 313. The transfer process will be described in detail below.

First, the transfer machine 36 scoops up the wafer 31 housed in the pod 21 with the wafer mounting plate (tweezer) 37, then moves to the boat 38 side, causes the tweezer 37 to face the boat 38, and charges a wafer charge groove (not illustrated) of the boat 38 with the wafer 31. Then, predetermined processing is performed on the wafer 31 with which the boat 38 is charged. Thereafter, the transfer machine 36 scoops up the wafer 31 with which the boat 38 is charged using the tweezer 37, moves to the pod 21 side, is rotated to cause the tweezer 37 to face the pod 21, and charges a wafer charge groove (not illustrated) of the pod 21 with the wafer 31.

Here, in the transfer process as described above, it is necessary to accurately charge the wafer charge groove with the wafer 31. That is, when a case of charging the boat 38 with the wafer 31 is exemplified, it is necessary to accurately position the wafer 31 in the front-rear direction (X-axis direction), the left-right direction (Y-axis direction), and the up-down direction (Z-axis direction) using the tweezer 37 with respect to the wafer charge groove disposed in a column portion of the boat 38 and to charge the wafer charge groove with the wafer 31 (see FIG. 2). Therefore, teaching is performed for an operation of the transfer machine 36 prior to an actual transfer process (actual process), and in the transfer process in the actual process, the transfer machine 36 accurately positions the wafer 31 and charges the wafer charge groove with the wafer 31. That is, operations of the servo motors 327, 328, 427, and 428 that operate the Z-axis direction driver 361, the Y-axis rotation driver 362, the X-axis direction driver 363, and the V-axis direction driver 364 of the transfer machine 36 are stored in the power saving controller 313 by teaching.

When the teaching as described above is performed, a predetermined jig may be used instead of the wafer 31, or each driver may be directly and manually moved. In this case, a worker operates the main operator 312 to set the substrate processing apparatus 1 to a predetermined state such as a maintenance state. Subsequently, the worker operates the main operator 312 to designate any of the servo motors 327, 328, 427, and 428 to be turned off. This designation may be a direct designation or an indirect designation to designate a work name. When the substrate processing apparatus 1 is in a predetermined state (maintenance state) and the power saving controller 313 receives a host designation, the power saving controller 313 turns off one or more designated drive circuits among a plurality of drive circuits in the plurality of servo amplifiers (325, 326, and the like) that control the servo motors 327, 328, 427, and 428, and turns on the other drive circuits. At this time, motion of the output shaft or the object of a servo motor in which the drive circuit is turned off (servo OFF state) is not restricted, and the worker can move the output shaft or the object to a desired position. These operations are completed, and then the turned-off drive circuit is turned on again, and the remaining teaching steps are continued.

Alternatively, teaching can be performed by turning on only a drive circuit of a servo motor serving as a teaching target and turning off drive circuits of servo motors not serving as teaching targets. In the Z-axis direction driver 361, the Y-axis rotation driver 362, the X-axis direction driver 363, and the V-axis direction driver 364, for example, when the servo motor 327 that controls the Z-axis direction driver 361 serves as a teaching target, the servo amplifier 325 that controls the servo motor 327 is brought into a servo ON state, and the servo amplifiers (326 and the like) that control the servo motors 328, 427, and 428 not serving as teaching targets are brought into a servo OFF state. As a result, even if the worker erroneously issues a movement command to a driver not serving as a teaching target, the driver does not operate, and therefore collision with the worker can be avoided.

At this time, motion of the output shaft or the object of a servo motor in which the drive circuit is turned off (servo OFF state) is not restricted. This is effective not only in the teaching but also in a case where there is a driver that may collide with a worker due to an operation error or the like in work performed by the worker entering the substrate processing apparatus 1. Conventionally, a fixing jig that mechanically restricts motion of a driver has been used for such work, but it takes time to install and remove the jig in order to obtain sufficient strength. According to this example, the fixing jig is unnecessary, and a user does not forget to remove the fixing jig.

Although the present disclosure has been specifically described above based on the examples, the present disclosure is not limited to the above embodiments and examples, and it goes without saying that various modifications can be made.

According to the present disclosure, it is possible to reduce power consumption of a transfer device controlled by a servo motor.

What is claimed is:

1. A substrate processing apparatus comprising a transfer device that transfers an object,
    the transfer device comprising:
    (a) a motor;
    (b) a drive circuit of the motor;
    (c) an encoder configured to detect a rotation angle of an output shaft of the motor;
    (d) a drive system configured to transmit motion of the output shaft of the motor to the object;
    (e) an origin sensor configured to detect that a predetermined site of the drive system interlocked with the object has reached a predetermined position;
    (f) a servo amplifier including the drive circuit and configured to hold a current position of the object based on detection by the encoder and the origin sensor and to control the object such that the object is located at a target position;
    (g) an absolute position holder configured to acquire an absolute position of the predetermined site based on detection by the encoder at least while the drive circuit is turned off; and
    (h) a controller configured to be bidirectionally communicable with the servo amplifier and configured to be capable of resuming servo control with the absolute position recorded in the absolute position holder as a current position of the predetermined site when the drive circuit is turned on.

2. The substrate processing apparatus according to claim 1, comprising:
    a plurality of sets of (a) to (g), wherein;
    the controller configured to be able to turn off one or more designated drive circuits among the plurality of drive circuits, and turn on the other drive circuits when the transfer device is in a predetermined state, and motion of the output shaft or the object of the motor in which the drive circuit is turned off is not restricted.

3. The substrate processing apparatus according to claim 1, wherein;
the controller configured to be able to control the servo amplifier such that the object substantially stands still at a current position during a period from a return from a power saving state to reception of a new operation request from a host controller.

4. The substrate processing apparatus according to claim 2, wherein;
the controller controls the servo amplifier such that the transfer device is located at a home position before entering a power saving state.

5. The substrate processing apparatus according to claim 4, wherein;
the home position is set to a position where interference is less likely to occur only by movement of one of the plurality of drive systems.

6. The substrate processing apparatus according to claim 2, wherein;
the controller includes a CPU configured to perform control to convert an operation request from a host controller into a detailed position command based on the current position of the object, and
the controller or the servo amplifier includes an operation controller configured to calculate, under control of the CPU, a rotation amount of each of the plurality of motors corresponding to positions where the plurality of drive systems should be located based on the current position of the object in time series.

7. The substrate processing apparatus according to claim 1, wherein at least a part of the absolute position holder is implemented by an independent microcomputer whose power is backed up by a battery.

8. The substrate processing apparatus according to claim 1, wherein the absolute position holder is configured to be able to count a pulse from the encoder without being limited by the number of rotations of the encoder.

9. The substrate processing apparatus according to claim 1, wherein the absolute position holder comprises: a determinator configured to determine whether the motor is in operation or in stop; a position acquisition monitor configured to acquire a position detected by the encoder and to monitor whether or not there is a change in the rotation angle of the motor; and a current position calculation holder.

10. The substrate processing apparatus according to claim 9, comprising a target position calculation holder configured to accumulate a position command represented by a relative position and given to the servo amplifier or to hold data of an absolute position before being converted into the position command represented by a relative position to hold data of a latest target position.

11. The substrate processing apparatus according to claim 10, comprising a deviation calculator configured to obtain a deviation between data of a target position held by the target position calculation holder and data of a current positions held by the current position calculation holder, and calculate the number of deviation pulses.

12. The substrate processing apparatus according to claim 1, wherein the absolute position holder counts a pulse from the encoder and updates an absolute position only while the motor is stopped or the drive circuit is in an OFF state.

13. The substrate processing apparatus according to claim 3, wherein the controller generates a position command for directly moving from the current position to a target position corresponding to the new target position, and gives the position command to the servo amplifier.

14. A method of manufacturing a semiconductor device, the method comprising:
driving a motor by a drive circuit of an object transfer device, transmitting motion of an output shaft of the motor to the object by a drive system, and detecting a rotation angle of the output shaft of the motor by an encoder;
recording a current position of the object based on detection by the encoder and an origin sensor, and controlling the object to be located at a target position by a servo amplifier;
acquiring an absolute position of a predetermined site based on detection by the encoder and recording the absolute position in an absolute position holder at least while the drive circuit is turned off; and
resuming control of the servo amplifier with the absolute position recorded in the absolute position holder as a current position of the predetermined site by a controller configured to be bidirectionally communicable with the servo amplifier when the drive circuit is turned on, wherein
the object is a substrate or a substrate container.

15. A method of processing a substrate comprising:
driving a motor by a drive circuit of an object transfer device, transmitting motion of an output shaft of the motor to the object by a drive system, and detecting a rotation angle of the output shaft of the motor by an encoder;
recording a current position of the object based on detection by the encoder and an origin sensor, and controlling the object to be located at a target position by a servo amplifier;
acquiring an absolute position of a predetermined site based on detection by the encoder and recording the absolute position in an absolute position holder at least while the drive circuit is turned off; and
resuming control of the servo amplifier with the absolute position recorded in the absolute position holder as a current position of the predetermined site by a controller configured to be bidirectionally communicable with the servo amplifier when the drive circuit is turned on, wherein
the object is a substrate or a substrate container.

16. A tangible non-transitory computer-readable recording medium storing a program configured to cause a computer of a substrate processing apparatus to execute the method of processing a substrate according to claim 15.

* * * * *